US010498331B2

(12) United States Patent
Schmitz et al.

(10) Patent No.: US 10,498,331 B2
(45) Date of Patent: Dec. 3, 2019

(54) SWITCHING DEVICE FOR CONDUCTING AND INTERRUPTING ELECTRICAL CURRENTS

(71) Applicant: EATON INTELLIGENT POWER LIMITED, Dublin (IE)

(72) Inventors: Gerd Schmitz, Niederkassel (DE); Johannes Meissner, Bonn (DE); Marcel Uedelhoven, Blankenheim (DE); Michael Wohlang, Bornheim (DE); Oliver Kreft, Bonn (DE)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 16/091,108

(22) PCT Filed: Mar. 16, 2017

(86) PCT No.: PCT/EP2017/056319
§ 371 (c)(1),
(2) Date: Oct. 4, 2018

(87) PCT Pub. No.: WO2017/174328
PCT Pub. Date: Oct. 12, 2017

(65) Prior Publication Data
US 2019/0131966 A1 May 2, 2019

(30) Foreign Application Priority Data

Apr. 7, 2016 (DE) .................. 10 2016 106 414

(51) Int. Cl.
*H03K 17/28* (2006.01)
*H01H 9/54* (2006.01)
(Continued)

(52) U.S. Cl.
CPC ......... *H03K 17/28* (2013.01); *G06K 7/10366* (2013.01); *H01H 9/542* (2013.01);
(Continued)

(58) Field of Classification Search
CPC .... H03K 17/28; H06K 7/10366; H01H 9/542; H01H 9/56; H01H 33/04; H01H 33/596; H01H 47/22; H01H 2009/544
See application file for complete search history.

(56) References Cited

U.S. PATENT DOCUMENTS 3,639,808 A   2/1972  Ritzow
4,356,525 A  10/1982  Kornrumpf et al.
(Continued)

FOREIGN PATENT DOCUMENTS

DE      4244116 C1   3/1994
DE  102013114259 A1   6/2015

*Primary Examiner* — Daniel C Puentes
(74) *Attorney, Agent, or Firm* — Leydig, Voit & Mayer, Ltd.

(57) ABSTRACT

A switching device for conducting and disconnecting electric currents includes: a first mechanical contact assembly; a semiconductor switch, which is in parallel to the first mechanical contact assembly; a second mechanical contact assembly, which is connected in series to the first mechanical contact assembly; and a switching electronics, which switch on and off the semiconductor switch. The switching electronics are operable, during a closing process of the first mechanical contact assembly, to turn on the semiconductor switch after a first predetermined time period t-0 after initialization of the switching electronics, and to turn the semiconductor switch off again after a second predetermined time period t-1. The first predetermined time period t-0 is set by the switching electronics depending on the first mechanical contact assembly.

10 Claims, 5 Drawing Sheets

(51) Int. Cl.
  *H01H 33/04* (2006.01)
  *H01H 33/59* (2006.01)
  *G06K 7/10* (2006.01)
  *H01H 9/56* (2006.01)
  *H01H 47/22* (2006.01)

(52) U.S. Cl.
  CPC ............. *H01H 9/56* (2013.01); *H01H 33/04* (2013.01); *H01H 33/596* (2013.01); *H01H 47/22* (2013.01); *H01H 2009/544* (2013.01)

(56) References Cited

U.S. PATENT DOCUMENTS

| | | | |
|---|---|---|---|
| 4,764,836 | A | 8/1988 | Mauthe et al. |
| 6,643,112 | B1 | 11/2003 | Carton et al. |
| 2010/0282082 | A1 | 11/2010 | Butler et al. |
| 2014/0332500 | A1* | 11/2014 | Pessina .................. H01H 33/04 218/4 |
| 2016/0322184 | A1 | 11/2016 | Schmitz et al. |

* cited by examiner

SWITCHING DEVICE FOR CONDUCTING AND INTERRUPTING ELECTRICAL CURRENTS

CROSS-REFERENCE TO PRIOR APPLICATIONS

This application is a U.S. National Phase application under 35 U.S.C. § 371 of International Application No. PCT/EP2017/056319, filed on Mar. 16, 2017, and claims benefit to German Patent Application No. DE 10 2016 106 414.9, filed on Apr. 7, 2016. The International Application was published in German on Oct. 12, 2017 as WO 2017/174328 under PCT Article 21(2).

FIELD

The invention relates to a switching device for conducting and disconnecting electric currents, in particular, a hybrid switching assembly for conducting and disconnecting high DC currents and low-frequency AC currents, and a switching instrument having such a switching device.

BACKGROUND

In the published German patent application DE 10 2013 114 259 A1, an advantageous variant of a hybrid switching assembly is described, in which the current load of the power semiconductor is minimized over time in order to achieve the highest possible life expectancy as well as the lowest possible dimensioning, which is important especially for power contactors in the current range of several hundred amperes. In order to minimize the time of the load current flowing through the power semiconductor, the commutation time is detected by a current transformer, and the current flow through the semiconductor is maintained only until the opening mechanical switching path has reached a sufficient electrical stability. In this short time, the load current is artificially brought to zero by the semiconductor via its control, so that a safe galvanic isolation is achieved after opening both the extinguishing contact- and the isolating contact assembly connected thereto in series.

When designing a switching instrument, so as to ensure functional safety and to achieve long electrical life, one important task is to prevent heat sealing of the switching contacts. Even when using a suitable contact material, as well as a sufficient contact size, in principle, there is a risk that during the switch-on process, a short contact rebound will occur in the contact, especially for switching instruments for currents in the range of a few hundred amps, for which comparatively high contact pressure forces are required. During such a rebound process brief arcing occurs between the minimally open contacts.

In particular at high arc currents, in the region of the foot-points, local melting of the contact surfaces may occur, which then leads to heat sealing of the two contacts in the renewed, directly following contacting.

The tendency for heat sealing increases here, in particular in contacts whose surfaces already have an altered topography due to numerous switching drives affected by electrical arcing. Here preferably in the range of contact peaks there is point-form heat sealing. If it is not possible to break up such heat sealing during the subsequent switch-off process using switching drives, the switching instrument is no longer functional. Basically, this also applies to hybrid switches. For example, during switch-on of the hybrid switching assembly described in the published German patent application DE 10 2013 114 259 A1, if there is heat sealing of so-called extinguishing contacts, commutation to the power semiconductor no longer occurs during the subsequent switch-off process, which is made possible by the mechanical opening of the extinguishing contacts. In the absence of commutation of the load current to the IGBT, the hybrid switch loses its basic function by briefly passing the load current through the semiconductor, to zeroize the latter. Opening the second mechanical contact assembly, which is responsible for galvanic isolation of the hybrid switch, leads to the formation of long-term electrical arcing and thus to the destruction of the switching instrument.

U.S. Pat. No. 3,639,808 describes a protection circuit for a switching contact of a relay having a triac connected in parallel to a switching contact, which is through-connected prior to the closing and after the opening of the switching contact for a short time interval, to avoid the formation of arcing on the switching contact. In particular, according to U.S. Pat. No. 3,639,808, the triac is through-connected approx. 5-15 milliseconds before closing of the switching contact. However, when the currents to be switched are very large, this can result in considerable loading of the triac and thus to an associated lifespan reduction.

SUMMARY

In an embodiment, the present invention provides a switching device for conducting and disconnecting electric currents, comprising: a first mechanical contact assembly; a semiconductor switch, which is in parallel to the first mechanical contact assembly; a second mechanical contact assembly, which is connected in series to the first mechanical contact assembly; and a switching electronics, which is configured to switch on and off the semiconductor switch, wherein the switching electronics is configured, during a closing process of the first mechanical contact assembly, to turn on the semiconductor switch after a first predetermined time period t-0 after initialization of the switching electronics and to turn the semiconductor switch off again after a second predetermined time period t-1, and wherein the first predetermined time period t-0 is set by the switching electronics depending on the first mechanical contact assembly.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
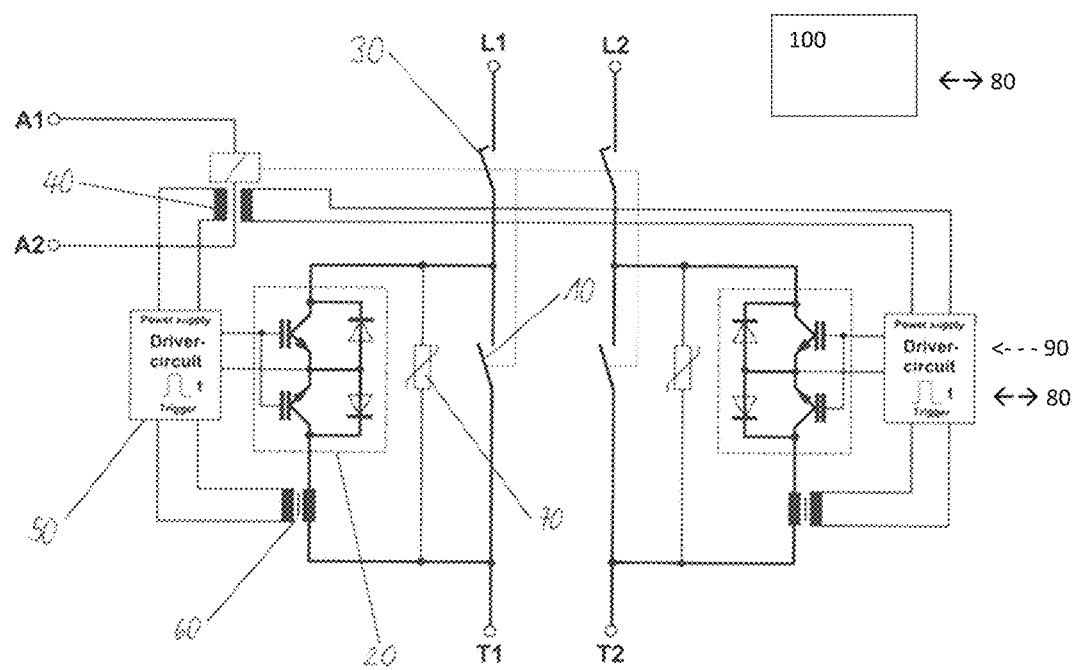
FIG. 1, a block diagram of an exemplary embodiment of a switching device with a double contact assembly according to the invention.

In an embodiment, the present invention provides a switching device for conducting and disconnecting electrical currents, in particular an improved hybrid switching assembly for conducting and disconnecting high DC-currents and low-frequency AC-currents, and an improved switching instrument of such a switching device, in which the risk of forming unwanted switching arcs is reduced and thereby an increased functional reliability as well as a very high electrical lifespan can be achieved.

The present invention in an embodiment modifies a hybrid switch, such as the switch described above and known from the published German patent application DE 10 2013 114 259 A1, in such a way that, like the protection circuit known from U.S. Pat. No. 3,639,808 during the closing process of a mechanical contact assembly, a semiconductor switch connected in parallel to the latter is connected or through-connected at least for a short time, so as to effect a time-limited commutation of the current flow starting with mechanical contacting to the semiconductor switches, and thus to suppress switch arcing, which can occur due to bouncing of the mechanical contact assembly. Ideally, during the switching-on process the contacts no longer experience any bounce-induced electric-arc load.

To keep the current load of the semiconductor switch as low as possible, the invention provides that, after initializing switching electronics for controlling the semiconductor switch, there is a predetermined wait period until the semiconductor switch is turned on, and the predetermined time period is set depending on the mechanical contact assembly, so that it is adapted to the mechanical contact assembly.

This makes it possible to move the commutation time of the current flow to the semiconductor switch so close to the contact time of the mechanical contact assembly that too strong a current load of the semiconductor switch and a lifespan reduction caused thereby in certain circumstances may be avoided.

An embodiment of the invention now relates to a switching device for conducting and disconnecting electric currents having a first mechanical contact assembly, a semiconductor switch, which is connected in parallel to the first mechanical contact assembly, a second mechanical contact assembly, which is connected in series to the first mechanical contact assembly, and switching electronics for turning the semiconductor switch on and off. According to the invention, the switching electronic are configured, during the closing process of the first mechanical contact assembly, to turn on the semiconductor switch after the first predetermined time period t–0 after initiating the switching electronics, and to turn off it again after the second predetermined time period t–1, wherein the first predetermined time period t–0 is set by the switching electronics, depending on the first mechanical contact assembly.

In order to adjust the commutation of the current flow to the semiconductor switch even better at the first mechanical contact assembly, the switching electronics can also be built to set the second predetermined time period t–1 depending on the first mechanical contact assembly. For example, the time t–1 can be set to a time which is measured such that the contacts of the first mechanical contact assembly are reliably closed and no more switch bounce occurs, so that the bounce-related electric-arc loading of the contacts is further avoided, and the loading time of the semiconductor switch due to the commutated current flow is as short as possible.

Further, the switching electronics can be configured, to receive data for the first mechanical assembly after initialization of the switching elements, and depending on the received data to set the first predetermined time period t–0 and/or the second predetermined time period t–1. This data can comprise, for example, the characteristic values of the mechanical contact assembly, for example, typical time periods before a first closing of the contacts with allowance for inertia of the contact assembly. Data reception can be digital and/or analog, for example in the form of digital data or analogue measurement values.

For example, the switching electronics can be configured to receive data for the first mechanical contact assembly by measuring the voltage drop in the electrical resistor allocated to the first mechanical contact assembly; storing the measured value in a register as a characteristic value; with reference to the characteristic value and a value table with the properties of various mechanical contact assemblies; determining a blocking time suitable for the first mechanical contact assembly for the semiconductor switch; and setting the first predetermined time period t–0 depending on the determined blocking time.

In this case, data for the mechanical contact assembly are encoded analogously in the form of electrical resistance, which can vary type-specifically, and can at some point be integrated in a switching instrument integrated. The feed to the electrical resistor with current for generating a desired voltage drop can be done by the switching electronics themselves or by an external circuit. For example, the switching electronics can energize the electrical resistance immediately after their initialization and thereby measure the voltage drop in it. But the electrical resistor can also be supplied by a current supplying the switching device, and the switching electronics can measure the voltage dropping at it after initialization. The voltage drop in the electrical resistor can be measured, for example, with a corresponding cable connection, which is attached in the switching device in a switching instrument during installation or via a pin contact, which occurs automatically during assembly of two housing parts of the switching instrument.

The switching electronics can also be configured to receive data for the first mechanical contact assembly by activating a wireless reading device; using the activated reading instrument, reading the data stored in a transponder allocated to the first mechanical contact assembly; storing the read data in a register as a characteristic value, based on the characteristic value and a value table with the properties of various mechanical contact assemblies; determining a blocking time suitable for the first mechanical contact assembly for the semiconductor switch; and setting the first predetermined time period t–0, depending on the determined blocking time. The transponder can be, for example, an RFID (Radio Frequency Identification) chip, in particular, according to the NFC (Near Field Communication)—Standard (ISO 14443, 18092, 21481, ECMA 340, 352, 356, 362, ETSI TS 102 190), in particular, in a housing of the first mechanical contact assembly, which stores data for the first mechanical contact assembly. The wireless reading instrument can be built, for example, built as part of the switching electronics, which after switching-on initialization of the switching electronics, emits alternating magnetic fields which initially supplies the transponder (chip) with energy and then excites it to emit its individual identifier, which is read by the switching electronics.

Furthermore, the switching electronics can be configured, based on the characteristic value and the value table with the properties of various mechanical contact assemblies, to determine the commutation time suitable for the first mechanical contact assembly, and to set the second predetermined time period t–1 depending on the determined commutation time.

Another embodiment of the invention relates to a switching instrument with a switching device according to the invention and as described herein, and a switching drive for moving contacts of the first and second mechanical contact assemblies.

Another embodiment of the invention relates to a housing for a switching instrument according to the invention and as described herein, which has at least one electronic component and/or electrical contact means, which is/are provided respectively in order to be used for setting the first predetermined time period t–0 with switching electronics of a switching device of the switching instrument.

Finally, an embodiment of the invention relates to a method for controlling a semiconductor switch of a switching device for conducting and disconnecting electric currents, which has a first mechanical contact assembly, a semiconductor switch, which is connected in parallel to the first mechanical contact assembly, and a second mechanical contact assembly, which is connected in series to the first mechanical contact assembly, wherein in the method, the semiconductor switch, during a closing process of the first mechanical contact assembly after the first predetermined time period t 0 following initialization of the switching electronics built for the switching on and off of the semiconductor switch, is turned on and is turned off again after a second predetermined time period t–1, wherein the first predetermined time period t–0 is set by the switching electronics depending on the first mechanical contact assembly.

The method may be carried out by switching electronics built for switching on and off a semiconductor switch. In particular, the switching electronics can be implemented by a processor and a memory in which a program is stored, which configures the processor in order to perform the method according to the invention and as described herein.

Further advantages and application options of the present invention will become apparent from the following description in connection with the embodiments illustrated in the drawings.

In the description, in the claims, the abstract and drawings, the terms used in the attached list of the reference numerals and associated reference numerals are used.

In the following description, identical, functionally identical and functionally related elements can be provided with the same reference numerals. Absolute values are given below only by way of example and are not to be construed as limiting the invention.

FIG. 1 shows the block diagram of a switching device according to the invention, for a 2-pole, polarity-independent switching instrument. The connections of the switching instrument for the two poles are designated LI, T-1 and L2, T2 respectively. In terms of circuit technology, this switching device corresponds largely to the device described in the published German patent application DE 10 2013 114 259 A1 and shown therein in FIG. 1. The inventive device described below differs in circuit electronics 50, which are configured for special control of the semiconductor switch 20, as will be explained in the following description in more detail. The switching electronics 50 may be implemented, for example, by a processor and a memory (in particular, a microcontroller), wherein a program is stored in the memory, which configures the processor to perform method steps, which implements special control of the semiconductor switch 20 through the processor as exemplified below. The program can, for example, be part of the firmware of a processor-controlled switching instrument.

For each pole, the switching device shown in FIG. 1 has a parallel circuit of a first mechanical (extinguishing) contact assembly 10 with a semiconductor switch 20 based on an anti-serial IGBT-assembly (power semiconductor), which is connected to a second mechanical contact assembly 30 to ensure galvanic isolation in series. The mechanical contact assemblies 10 and 30 may be configured as a bridge circuit assembly of an air switching instrument or assembly.

The semiconductor switch 20 is turned on or off by the switching electronics 50, i.e., controlled or blocked. The switching electronics 50 are powered by energy stored in the (magnetic drive-) coil of the switching- or magnetic drive of the switching instrument. For this purpose, an auxiliary coil 40, galvanically isolated from the electrical circuit of the switching drive, is provided, which can generate voltage for powering the switching electronics 50 when turning off the switching drive. The auxiliary coil 40 may be wound around the drive coil, for example. Additionally or alternatively, the switching electronics 50 can be supplied by an external electrical energy source (external power supply 90), for example, from a central energy source, for the electrical units of a cabinet or via a bus system, to which a plurality of switching devices and the like are coupled.

When switched on, i.e., when the switching drive supplies the magnetic drive coil with voltage and current, and the contacts of the first and second mechanical contact assemblies 10 and 30 are closed, the semiconductor switch 20 is blocked, since in this state no voltage for powering the switching electronics 50 are generated by the auxiliary coil 40, and the switching electronics 50 are therefore without voltage and cannot control the IGBTs of the semiconductor switch 20.

At startup of the voltage- and current supply of the magnetic drive coil of the switching drive for closing the contacts of the first and second mechanical contact assemblies 10 and 30, energy is stored in the magnetic drive coil. Means of the coil current, a voltage is induced in the electromagnetic auxiliary coil 40 coupled to the magnetic drive coil, which activates the switching electronics 50.

The voltage induced in the auxiliary coil 40 is sufficient, on the one hand, to power the switching electronics 50 itself, and on the other hand, to build the necessary voltage for controlling the IGBTs.

The auxiliary coil 40 provides the advantage that the semiconductor switch can already be controlled before the closing of the contacts of the first and second mechanical contact assemblies 10 and 30 due to mechanical inertia.

At the moment of startup of the voltage- and current supply of the magnetic drive coil of the switching drive for closing the contacts of the first and second mechanical contact assemblies 10 and 30, the external power supply 90 can also be activated to activate the switching electronics 50.

An initialization process starts with activation of the switching electronics 50. After the completion of the initialization process, the IGBTs of the semiconductor switch 20 are first blocked for defined time t–0. This ensures that the time interval, in which the IGBTs are found in the connected state is not prior to mechanical contact of the first mechanical contact assembly 10. With switching instruments for currents of several hundred amperes, the inertia of the mechanical switching assembly is comparatively high, so that the time between cut-on of the coil current for the switching drive and the closing of the switching contacts is typically in the range of approx. 10 ms. However, the time for the initialization of the switching electronics 50 and the connection of the IGBTs of the semiconductor switch 20 is considerably shorter. The wait time t–0 is therefore set such that that the IGBT is through-connected just shortly before mechanical contact, with allowance for instrument-specific time tolerances. After first contact, if there a rebound of the extinguishing contacts, commutation of the load current to the semiconductor switch 20 takes place. This commutation time t−1 is measured such that the IGBTs, in order to minimize the thermal load, are immediately switched to the blocking state as soon as the switch bounce phase is completed. Another startup of the semiconductor switch 20 is then provided again only after initialization of a regular switch-off process.

Figure 2:
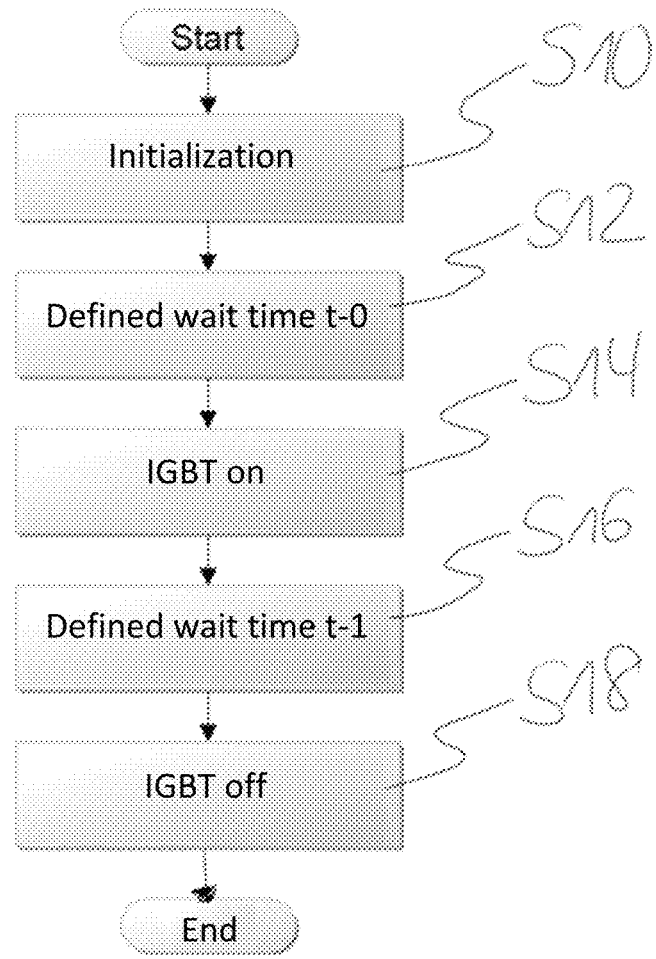
FIGS. 2-5, process charts of various embodiments of the control of a semiconductor switch by switching electronics of a switching device according to the invention.

The schematic basic control sequence for ensuring an electric-arc-free switch bounce is shown in FIG. 2: in step S10, the initialization of the switching electronics 50 takes place; in step S12, the switching electronics 50 wait a first predetermined time period t−0, during which the semiconductor switch 20 is turned off by the switching electronics 50; in step S14, the switching electronic 50 turns on the semiconductor switch 20; && in step S16, the switching electronics 50 waits for a second predetermined time period t−1, during which the semiconductor switch 20 is turned on by the switching electronics 50;

in step S18, the switching electronics 50 switches off the semiconductor switch 20 again.

To be able to realize arc-free startup, as described for various hybrid switches with a single uniform design of the control electronics, which is advantageous with respect to reducing the number of variants as well as manufacturing cost, to is now provided according to the invention to set the first predetermined time period t−0 with the switching electronics 50 depending on the first mechanical contact assembly 10.

For this purpose, the type of the used hybrid switch can be "reported" to the switching electronics 50 during the initialization phase, in that the switching electronics 50 receive an instrument identifier with data 80 for the first mechanical contact assembly 10, which are evaluated to set the first predetermined time period t−1.

Figure 3:
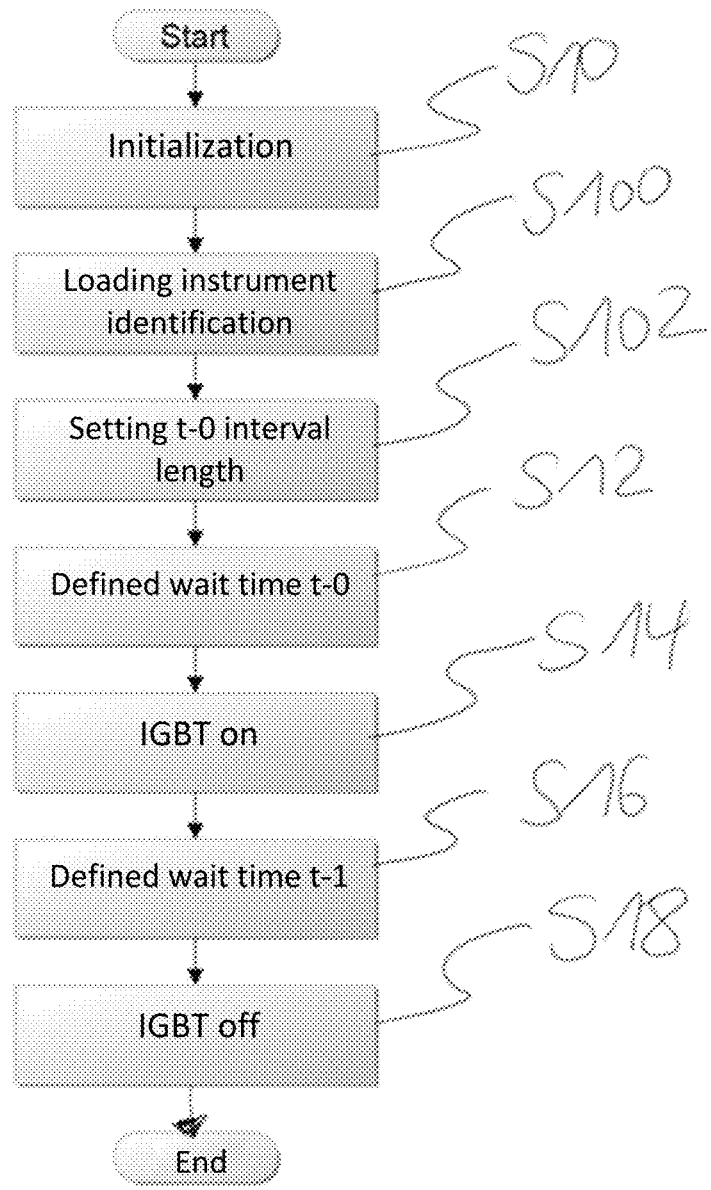

The schematic basic control sequence of such a startup control with integrated identification of an instrument-type is shown in FIG. 3: in step S10, the initialization of the switching electronics 50 takes place; in step S100, the instrument identifier is loaded; in step S102, the predetermined time period t−0 is set, depending on the loaded instrument identifier; the steps S12 to S18 correspond to the same numbered steps in the flow chart of FIG. 2, as described above.

The data 80 can be received in various ways, as will be explained below with reference to the flow charts in FIGS. 4 and 5:

In a variant via a cable connection (flow chart of FIG. 4), an individual identifier of the mechanical contact assembly 10 can be searched via the (standardized) switching electronics 50, in such a way that the voltage drop across an electrical resistance, which type-specifically differently drops and is integrated at any point in the switching device, is measured (step S1000). This can be done, e.g., via a corresponding cable connection, which is attached either by the instrument assembly or via a pin contact, which, e.g., takes place automatically during the assembly of two housing parts.

Figure 5:
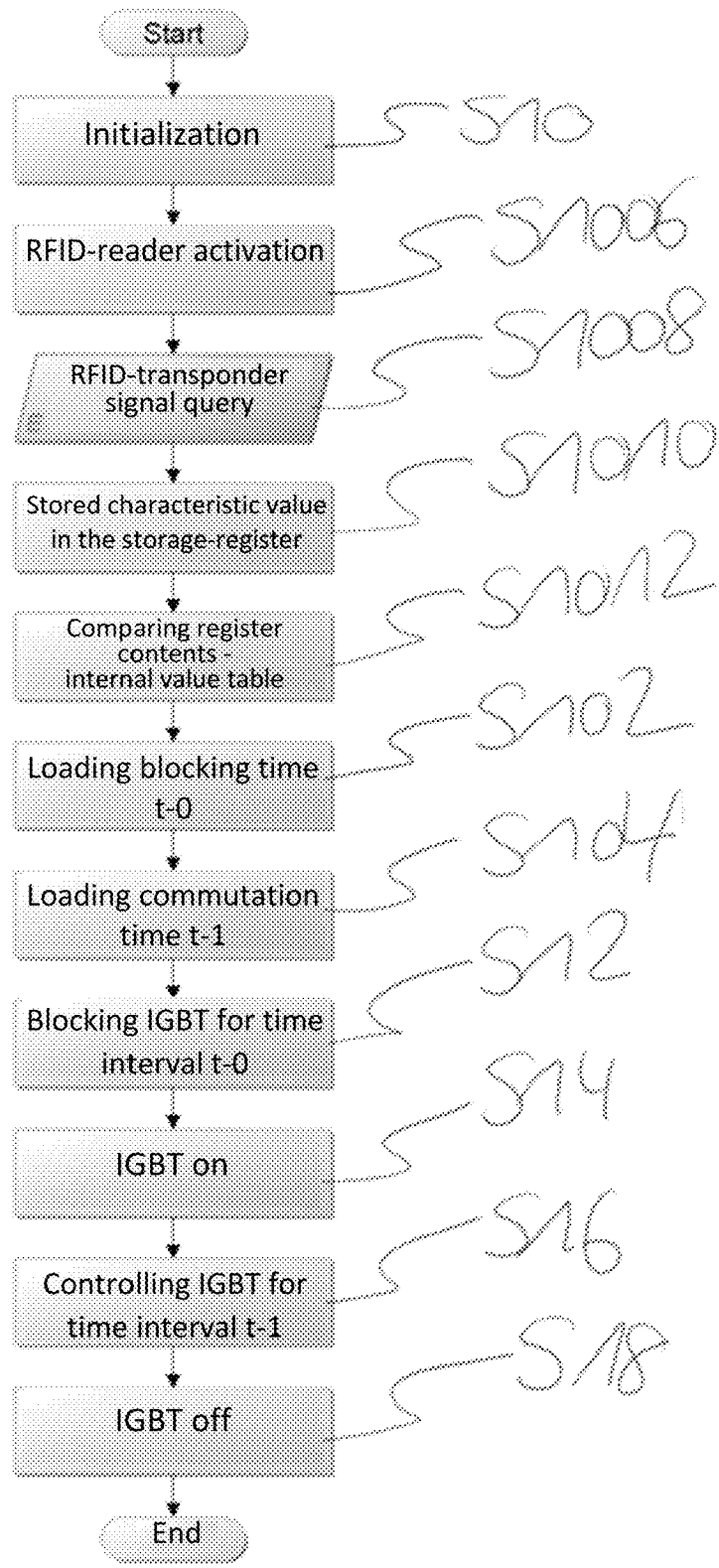

Another variant uses a wireless design, e.g., by the excitation of an RFID-transponder chips or tags 100 (flow chart of FIG. 5). By the switching instrument, such RFID-tag 100 can be integrated into any housing part. The "reading device" may, for example, be a part of the switching electronics 50, for example, integrated in this. After the power-on initialization and activation of the reading device (step S1006), the reading device of the switching electronics 50 sends alternating magnetic fields, which initially provide the transponder-chip with energy, and then stimulate it for the emission of its individual identifier, which is read by the control electronics (step S1008).

The data can also be set, for example, by individually precoding the electronics or by encoding the operating software, e.g., during instrument assembly, and then by the initialization of the switching electronics 50, can be received internally from this.

Figure 4:
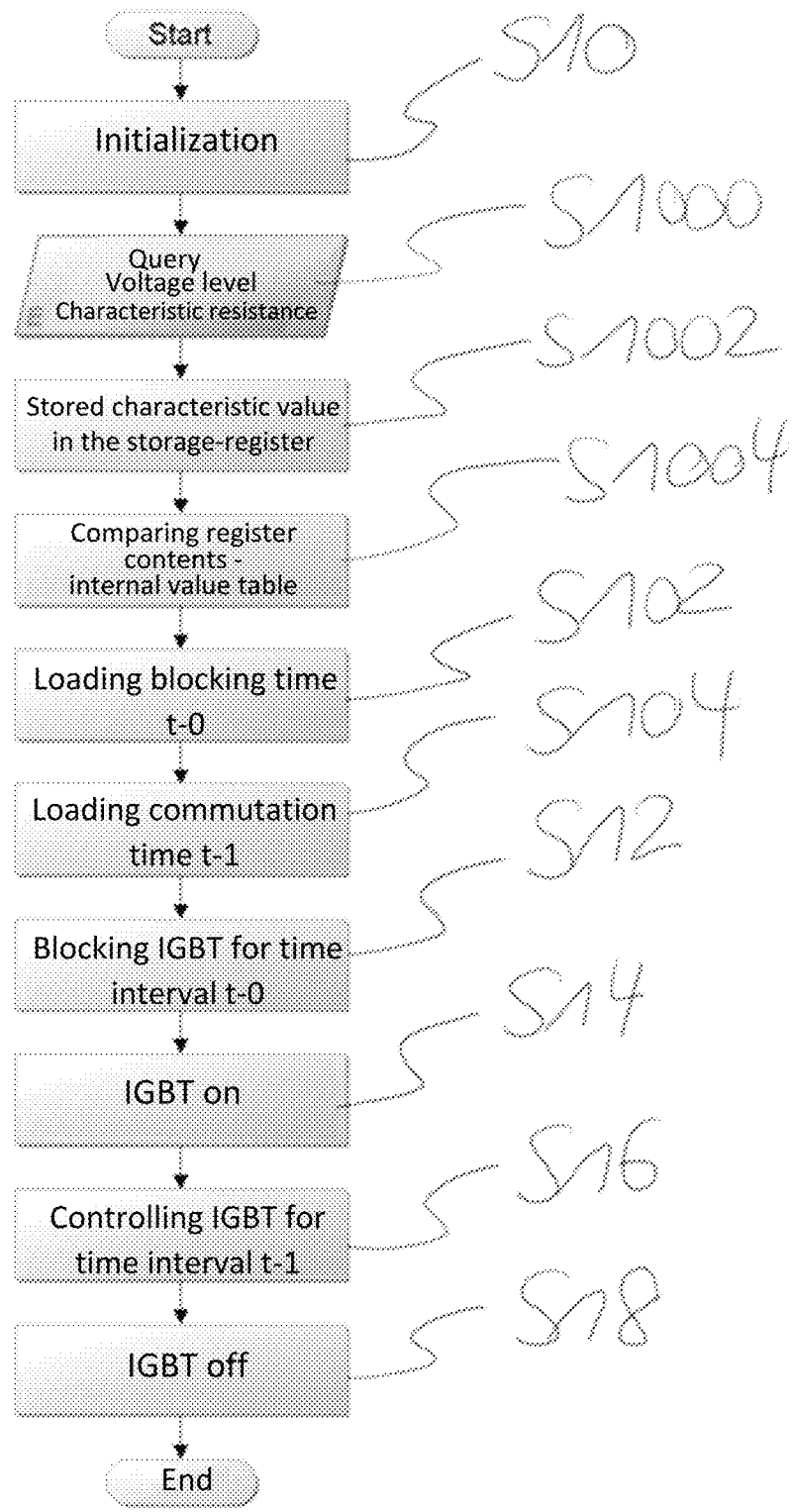

The data received from the switching electronics 50 are stored in a register as a characteristic value of the mechanical contact assembly 10 (step S1002 in FIG. 4, step S1010 in FIG. 5). The register can be, for example, a non-volatile memory, in particular, of the switching electronics 50, so that data 80 may not be received every time when initializing the switching electronics 50, but it can be read directly from the register. In the operating software of the switching electronics 50, a value table can be stored with the properties of various mechanical contact assemblies. The stored propertied may comprise, for example, the inertia times of the mechanical contact assemblies, by which suitable blocking times for the semiconductor switch 20 can be determined. But, the specified blocking times may be already stored in the value table for the various mechanical contact assemblies. In particular, a plurality of contact assembly variants in the value-table can be assigned respectively to a corresponding blocking time until the connection of the semiconductor switch 20 shortly before a mechanical contact. The first predetermined time period t−0 is then adjusted by the switching electronics 50 depending on the blocking time determined based on the value table, in particular, in that the characteristic value stored in the register is compared with the value stored in the value table (step S1004 in FIG. 4, step S1012 in FIG. 5), and in particular, depending on the comparison, a corresponding predetermined first time period t−0 is loaded or set, e.g., from the value table (step S102).

The adjusted predetermined time period t−0 can then, for example, be stored in a non-volatile storage, particularly switching electronics 50, which can be read out during the initialization of the switching electronics 50. Thereafter, the predetermined second time period t−1 may be loaded (step S104), in particular, from the value table, which determines the time period for turning on, or controlling the semiconductor switch 20. This second predetermined time period t−1 can be adjusted, depending on the first mechanical contact assembly 10, possibly also by the used semiconductor switch 20, in particular, depending on its current loading capacity.

In view of the longest possible electrical lifespan of IGBTs as well as their acceptable large dimensioning, it is expedient to limit the duration current flow through the semiconductor switch 20, in such a way that the current therein flows only so long until the mechanical switching path reaches sufficient reconsolidation. In order to minimize the current flow time through the semiconductor switch 20, the exact knowledge of the commutation time is important, because in each switching instrument, the effective times for the mechanical start-up process fluctuate for various reasons.

The time of commutation to the already controlled IGBT of the semiconductor switch 20 can be detected by a current transformer located 60 located there. The current transformer 60 generates a signal as soon as current starts to flow through the IGBT of the semiconductor switch 20, also the current flow commutates from the first mechanical contact assembly 10 to the semiconductor switch 20. The signal generated by the current transformer 60 and the commutation signaling signal is supplied to the switching electronics 50, which can control as described below, depending on the semiconductor switch 20.

Immediately after the performed commutation, the switching electronics 50 can control the semiconductor switch 20 in such a way that the IGBTs of the semiconductor switch 20 can be blocked again, shortly after the current flow time or conduction time, defined or predetermined by the switching electronics 50, so that the commutated load current in the semiconductor switch 20 is led to zero within the defined time period. The current flowing time is ideally measured via the switching electronics 50, so that the switching path with the first and second mechanical contact assemblies 10 or 30 is fully closed, i.e., the switching contacts are contacted permanently and any switching bounce process no longer occurs.

By equipping the semiconductor switch 20 with an antiserial-IGBT, such a switching assembly can be used both for DC currents with any current flow direction and for AC voltages of various frequencies, wherein the switching time, due to the independent supply of the control module, is not phase-angle-dependent. During the turning-off operation in the semiconductor switch 20, high current occurs at high dI/dt values, whereby the voltage spikes can occur well above 1 kV. For protection against such voltage spikes, it is expedient to connect a protective device, for example in the form of a varistor 70 upstream or in parallel to the semiconductor switch 20.

The present invention is particularly suitable for use in contactors, circuit breakers and motor protection switches, which are particularly designed for operation with direct current and/or low frequency currents.

It enables the switching of high direct currents and low frequency currents with a comparatively high electrical life, since long electric-arc burn times as well as a long current load of the semiconductor switch can be avoided. Furthermore, these properties allow the realization of comparatively compact switching instrument for high currents.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE NUMERALS 10 first mechanical contact assembly
20 semiconductor switch
30 second mechanical contact assembly
40 galvanically isolated auxiliary coil
45a first half-coil
45b second half-coil
46 U-shaped magnetic core
50 switching electronics
60 current converter
70 varistor
80 Data for the first mechanical contact assembly
90 power supply of the switching electronics
100 RFID-transponder chip

The invention claimed is:

1. A switching device for conducting and disconnecting electric currents, comprising:
a first mechanical contact assembly;
a semiconductor switch, which is in parallel to the first mechanical contact assembly;
a second mechanical contact assembly, which is connected in series to the first mechanical contact assembly; and
a switching electronics, which is configured to switch on and off the semiconductor switch,
wherein the switching electronics is configured, during a closing process of the first mechanical contact assembly, to turn on the semiconductor switch after a first predetermined time period t-0 after initialization of the switching electronics and to turn the semiconductor switch off after a second predetermined time period t-1, and
wherein the first predetermined time period t-0 is set by the switching electronics depending on the first mechanical contact assembly.

2. The switching device according to claim 1, wherein the switching electronics is configured to set the second predetermined time period t-1 depending on the first mechanical contact assembly.

3. The switching device according to claim 1, wherein the switching electronics is configured, after initialization of the switching electronics, to receive data for the first mechanical contact assembly and to set the first predetermined time period t-0 and/or the second predetermined time period t-1, depending on the received data.

4. A switching instrument, comprising:
the switching device according to claim 1; and
a switching drive for moving the contacts of the first and second mechanical contact assemblies.

5. A housing for the switching instrument according to claim 4, comprising:
at least one electronic component and/or electrical contact device for setting the first predetermined time period t-0 by the switching electronics of the switching device of the switching instrument.

6. A method for controlling a semiconductor switch of a switching device for conducting and disconnecting electric currents, which has a first mechanical contact assembly, the semiconductor switch, which is in parallel to the first mechanical contact assembly, and a second mechanical contact assembly, which is connected in series to the first mechanical contact, comprising:

switching on the semiconductor switch, during a closing process of the first mechanical contact assembly, after a first predetermined time period t–0 after initialization of a switching electronics configured to switch on- and off the semiconductor switch; and switching the semiconductor switch off after a second predetermined time period t–1, wherein the first predetermined time period t–0 is set by the switching electronics, depending on the first mechanical contact assembly.

7. The method according to claim 6, wherein the method is performed by the switching electronics, wherein the switching electronics comprises a processor and a memory in which a program is stored, the program being operable to configure the processor to carry out the method.

8. A switching device for conducting and disconnecting electric currents, comprising:

a first mechanical contact assembly;

a semiconductor switch, which is in parallel to the first mechanical contact assembly;

a second mechanical contact assembly, which is connected in series to the first mechanical contact assembly; and a switching electronics, which is configured to switch on and off the semiconductor switch, wherein the switching electronics is configured, during a closing process of the first mechanical contact assembly, to turn on the semiconductor switch after a first predetermined time period t–0 after initialization of the switching electronics and to turn the semiconductor switch off after a second predetermined time period t–1, wherein the first predetermined time period t–0 is set by the switching electronics depending on the first mechanical contact assembly, wherein the switching electronics is configured to set the second predetermined time period t–1 depending on the first mechanical contact assembly, and wherein the switching electronics is configured to receive data for the first mechanical contact assembly, while:

activating a wireless reading device;

reading data stored in a transponder associated with the first mechanical contact assembly with the wireless reading device;

storing the read-out data in a register as a characteristic value;

determining a blocking time for the first mechanical contact assembly for the semiconductor switch, based on the characteristic value and a value table that includes properties of various mechanical contact assemblies; and setting the first predetermined time period t–0 depending on the determined blocking time.

9. A switching device for conducting and disconnecting electric currents, comprising:

a first mechanical contact assembly;

a semiconductor switch, which is in parallel to the first mechanical contact assembly;

a second mechanical contact assembly, which is connected in series to the first mechanical contact assembly; and a switching electronics, which is configured to switch on and off the semiconductor switch, wherein the switching electronics is configured, during a closing process of the first mechanical contact assembly, to turn on the semiconductor switch after a first predetermined time period t–0 after initialization of the switching electronics and to turn the semiconductor switch off after a second predetermined time period t–1, wherein the first predetermined time period t–0 is set by the switching electronics depending on the first mechanical contact assembly, wherein the switching electronics is configured, after initialization of the switching electronics, to receive data for the first mechanical contact assembly and to set the first predetermined time period t–0 and/or the second predetermined time period t–1, depending on the received data, and wherein the switching electronics is configured to receive data for the first mechanical contact assembly, while:

measuring a voltage drop by electrical resistance associated with the first mechanical contact assembly;

storing the measured value in a register as a characteristic value;

determining a blocking time for the first mechanical contact assembly for the semiconductor switch based on the characteristic value and a value table that includes properties of various mechanical contact assemblies; and setting the first predetermined time period t–0 depending on the determined blocking time.

10. The switching device according to claim 9, wherein the switching electronics is configured to determine a commutation time for the first mechanical contact assembly, based on the characteristic value and a value table that includes properties of various mechanical contact assemblies, and to set the second predetermined time period t–1 depending on the determined commutation time.

* * * * *